July 19, 1960 B. JACOBS 2,945,285

BONDING OF SEMICONDUCTOR CONTACT ELECTRODES

Filed June 3, 1957 2 Sheets-Sheet 1

INVENTOR
BERNARD JACOBS
BY [signature]
ATTORNEY

BONDING OF SEMICONDUCTOR CONTACT ELECTRODES

Filed June 3, 1957 2 Sheets-Sheet 2

INVENTOR
BERNARD JACOBS
BY R. J. Craddock
ATTORNEY

United States Patent Office 2,945,285

Patented July 19, 1960

2,945,285

BONDING OF SEMICONDUCTOR CONTACT ELECTRODES

Bernard Jacobs, Norwalk, Conn., assignor to Sperry Rand Corporation, a corporation of Delaware Filed June 3, 1957, Ser. No. 663,078

8 Claims. (Cl. 29—25.3)

This invention relates to improvements in the art of making semiconductor devices such as contact rectifiers and transistors of the junction type, and is particularly adapted, though not exclusively so, to the fabrication of semiconductor devices wherein silicon is used as the principal constituent of the base material.

Although it has been generally recognized that silicon has desirable characteristics as a base material in semiconductor devices, the manufacture of such devices with silicon has been complicated by the difficulties of fusing or soldering contact electrodes to the silicon, owing to the formation of oxide films which prevent wetting of the silicon by molten metal. Another problem in the fabrication of semiconductor devices is that of removing material that overlaps the asymmetrically conductive junctions and tends to degrade or prevent operation of the device. In the past, the overlapping material has been removed by etching the peripheral area of the junction. Chemical etching has the disadvantage that it acts on the entire silicon surface and parts that may be assembled with it at the time of etching. Electrolytic etching as practiced heretofore enables preferential etching, but is not fully effective because ions from the electrolyte are deposited on the junction when the current is turned off, shorting the junction almost as badly as the overlap that is removed.

The principal object of this invention is to provide an improved method of forming uniform intimate bonds between contact electrodes and a body of semiconductor material, such as silicon.

Another object is to provide an improved method of electrolytically etching a junction whereby the redeposition of ions from the electrolyte onto the junction is prevented.

As will be explained in detail hereinafter, the first of the aforementioned objects is achieved by the use of metallic titanium or a reducing agent containing titanium as a flux to remove the oxide film from the surface of the semiconductor to which a contact is to be secured. Titanium in its molten state has a high affinity for oxygen, and is readily soluble in other metals such as are used for contact electrodes. In addition, it is a member of group IV of the periodic table and therefore will not "dope" the semiconductor material or affect its content of donor or acceptor elements.

The second of the above objects is attained by reducing the concentration of the electrolyte while maintaining the polarizing voltage, until the electrolyte becomes substantially pure distilled water. This procedure prevents redeposition of ions from the electrolyte and leaves the junction free of short-circuiting agents.

Figures 1, 2:
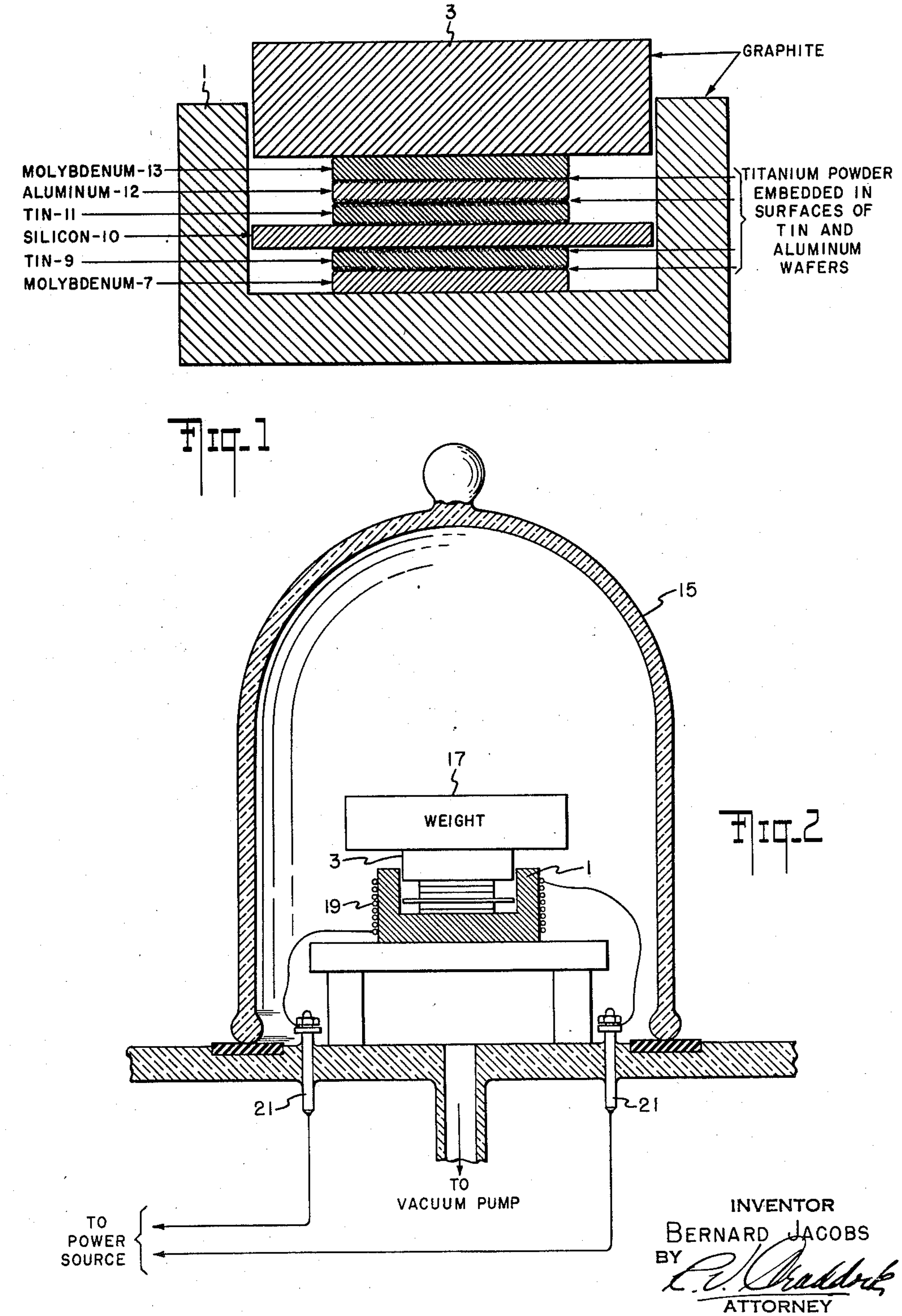
Figure 3:
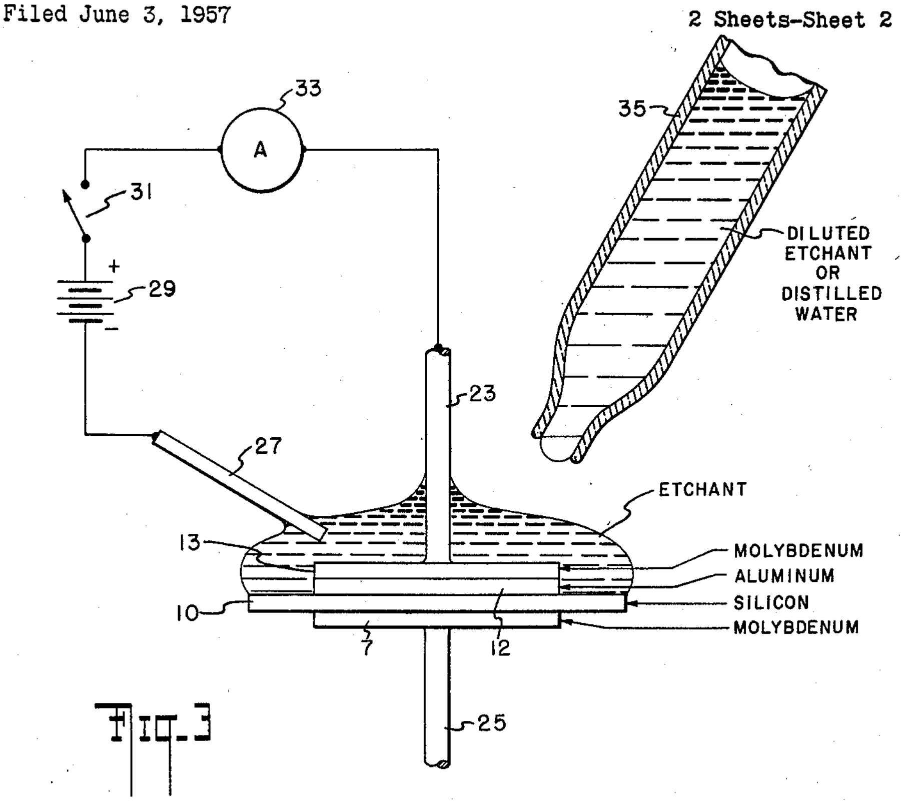
Figure 4:
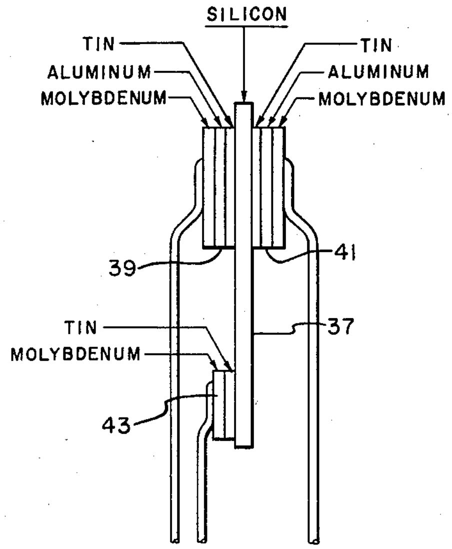

The invention will be described with reference to the accompanying drawings, wherein:

Fig. 1 is a representation in cross section of an assembly of the components of a silicon diode in a graphite jig, preparatory to the step of heating to fuse the junction, Fig. 2 shows an arrangement for heating the assembly of Fig. 1 in a vacuum, Fig. 3 illustrates the operation of etching a junction to remove the overlap, and Fig. 4 shows a silicon transistor made by the method of the present invention.

Although, as will become apparent, the present invention is applicable to the construction of a wide variety of semi-conductor devices, it will be described in detail with reference to making silicon diodes of the p–n junction type, by way of example. The silicon in this case is of the N type, i.e. highly purified silicon containing a very small percentage of a donor material comprising one or more of the elements in group V of the periodic table, such as arsenic. The silicon is formed by known methods, including grinding and lapping, into a thin wafer with flat surfaces whose area is determined by the desired current-carrying capacity of the finished diode. In diodes made as described herein, the current may be as high as 800 to 1000 amperes per square centimeter of active junction area. The thickness of the silicon wafer is preferably 0.007 to 0.008 inch.

The electrode members which are to be secured to the surfaces of the silicon wafer may also be in the form of wafers, preferably somewhat smaller than the silicon wafer. For example, the silicon wafer may be approximately ½ inch square. Wafers of tin may be made about ¼ inch diameter and 0.005 inch thick. A wafer of aluminum may be made ¼ inch diameter and 0.003 inch thick.

Titanium powder, preferably of a mesh size between 142 and 300 per inch, is sprinkled on both surfaces of the aluminum wafer and then pressed into the aluminum as by means of a hand press. The tin wafers are similarly treated with titanium powder. Two further wafers, of a relatively high melting point conductive material such as molybdenum, are made ¼ inch diameter and about 0.010 inch thick.

The wafers are then stacked in a graphite jig, as shown in Fig. 1. The jig consists of a generally cup-shaped body 1 having a cavity of appropriate size to receive the wafer stack, and a graphite cover 3. The wafers are stacked in the order shown, with a molybdenum wafer 7 on the bottom, followed by wafers 9, 10, 11, 12 and 13 of tin, silicon, tin, aluminum and molybdenum, respectively.

The loaded jig is placed in a vacuum chamber such as a bell jar 15 (Fig. 2). A weight 17 is placed on the cover 3 to hold the parts in position during the fusing operation. A heating element, for example a coil of Nichrome wire 19 surrounding the jig 3, is connected through terminal means 21 to an electric power source, not shown. The power source may include conventional regulating means for controlling the temperature of the heater element.

The air is exhausted from the chamber 15, which may then be filled with an inert gas such as argon. However, it is preferable to simply maintain the vacuum. The heater 19 is energized to raise the temperature of the jig 3 and its contents to a point substantially above the melting point of tin, but below that of titanium. The range of 550° C. to 850° C. has been found satisfactory, the upper part of the range being preferred. The temperature is maintained for a sufficient length of time to complete the fusing operation, about ten minutes in the present example.

The action that appears to take place is that as the tin liquefies, the titanium particles dissolve into it and the liquid spreads out and wets the adjacent surfaces of the silicon, aluminum and molybdenum wafers. It is believed that the titanium, having a high affinity for oxygen, reacts chemically with the silicon dioxide film on the silicon wafer and reduces it to silicon, and also removes any oxides from the tin, allowing the tin to alloy with the silicon at their interfacial region. The titanium may react in a similar manner with any nitrogen that is present, thereby further insuring that a substantially pure silicon surface is exposed to the action of the melted tin.

After the assembly has cooled and been removed from the jig, it is found that the wafers are intimately bonded throughout their contacting surfaces. If the stack is cross-sectioned for examination, it will be seen that the tin has not penetrated into the silicon to an objectionable depth, but has wet the surface substantially uniformly.

The molybdenum wafers are used principally as means for preventing the tin from wetting the graphite jig and sticking the assembly to the jig. These wafers also serve as terminals for connection of wires to the finished device.

After the above described fusing operation, it is usually found that some of the tin has flowed out and formed bridges between the silicon wafer and the adjacent contact elements, short circuiting the junction at the periphery. Also it is found that high leakage paths resulting from minor imperfections in the junction occur mostly at the periphery. The usual procedure in manufacturing semiconductor devices is to etch away a portion of the peripheral region of the junction to remove the above defects.

Simple chemical etching has the disadvantage of removing material from all exposed surfaces of the device, including contact elements and lead wires or anything else that may be part of the sub-assembly at the time of etching.

Electrolytic etching has also been used, by placing the assembly in a suitable electrolyte and maintaining the semi-conductor at a positive potential. The material to be removed is thereby deposited upon a cathode element immersed in the electrolyte. This method enables selective etching by proper biasing of the junction. However, it has the disadvantage that when the current is turned off, anions in the solution tend to redeposit a metallic layer upon the etched region, forming short circuits that are nearly as bad as the ones that were etched away.

In the practice of the present invention, redeposition is prevented by removing the electrolyte before disconnecting the current source. Referring to Fig. 3, the wafer stack has been provided with lead-in wires 23 and 25 soldered or otherwise secured to the molybdenum contact wafers 13 and 7. Either or both of these wires may be used in supporting the assembly with the wafers in approximately horizontal position as shown. A small quantity of etchant solution, for example a solution of ammonium bifluoride, is placed on the assembly in such manner as to cover the peripheral region of the junction. A sufficient quantity is retained in place by surface tension, as indicated. The etchant may cover all or part of the electrode members 12 and 13 as shown, or may, under suitable conditions, be disposed only in a ring-shaped region around the periphery of the interfacial region between the silicon and aluminum wafers.

A cathode 27, which may be made of platinum, gold, or any other conductor insoluble in the etchant solution, is immersed in the solution and is connected to the negative terminal of a D.-C. source 29. The positive terminal of the source 29 is connected through a switch 31 and a current meter 33 to the wire 23.

When the switch 31 is closed, material is removed from the exposed surface around the edge of the junction by electrolysis. By adjustment of the voltage of the source 29, the electrolytic action can be more or less restricted to the material that bridges the silicon-aluminum junction, so that the rest of the device is not etched to any undesirable extent. After the etching is complete, the electrolyte is displaced, carrying with it the anions that remain in it, by the addition of distilled water or of etchant which is progressively diluted with distilled water. The diluent may be added drop by drop as indicated by the dropper 35.

As the electrolyte becomes more dilute, its conductivity decreases, as shown by progressive reduction in the current indicated by the meter 33. When the etchant has been completely displaced by distilled water, the meter will indicate substantially the conductivity of the distilled water and the switch may be opened and the unit dried. The device is then ready for testing and encapsulation or mounting in a suitable sealed holder.

Silicon diodes made as described above and of the above-mentioned dimensions have shown a conductance in the forward direction of 50 amperes at one volt, and in the backward direction 3 microamperes at one hundred volts.

Although the invention has been described with reference to the making of a particular type of silicon diode, it is equally applicable to other junction semiconductor devices, for example, transistors. Fig. 4 shows a transistor of the p-n-p type, using silicon as the base electrode 37, and aluminum as the electrodes 39 and 41 forming asymmetrically conductive junctions with the base. As in the previously described diode, wafers of tin treated with titanium are placed between the surfaces that are to form the junctions. The ohmic junction in the transistor may be formed between a molybdenum wafer 43 and a part of the base 37, as shown. The fusing and etching operations may be the same as in the case of the diode.

The same methods of titanium treatment, fusing and etching can be used with other base materials and with electrode materials other than those in the above examples. At present it is preferred to use the titanium in powdered or granulated form. However the invention may be practiced by using the titanium in the form of a thin foil placed in close contact with the wafers of alloying material. Lead or alloys of lead and tin may be used instead of tin as the fusible alloying material.

While the invention has been described in its preferred embodiment, it is to be understood that the words which have been used are words of description rather than of limitation and that changes within the purview of the appended claims may be made without departing from the true scope and spirit of the invention in its broader aspects.

What is claimed is:

1. The method of producing a junction between a silicon semiconductor body and an aluminum electrode member, comprising the steps of applying titanium to the surfaces of a wafer of tin, placing one of said surfaces in contact with a surface of said semiconductor body, placing said electrode member in contact with the other surface of said fusible wafer, and heating said surfaces to a temperature in the range of 550° C. to 850° C. to cause said wafer to dissolve said titanium and wet said surface of said semiconductor body.

2. The method set forth in claim 1, wherein said titanium is in the form of a powder.

3. The method set forth in claim 1, wherein said heating is carried out in the absence of air.

4. The method set forth in claim 2, wherein said powder is applied to said surface of said electrode member by pressing said powder into intimate adhesive contact with said surface.

5. The method set forth in claim 4, wherein said powder is of mesh size between 142 and 300 per inch.

6. The method of making a semiconductor device, comprising the steps of forming a wafer of silicon, a wafer of aluminum, and two wafers of tin, applying powdered titanium to at least one surface of each of said tin wafers by pressure whereby said powder adheres to said surfaces, stacking said wafers with titanium treated surfaces of said tin wafers in contact with said silicon wafer and with said aluminum wafer in contact with one of said tin wafers, and heating the assembly in the absence of air to a temperature within the range of 550° C. to 850° C. to cause the titanium to dissolve in the tin and the tin to spread out and wet the silicon and aluminum.

7. The method set forth in claim 6, including the further steps of placing wafers of molybdenum at the ends of said stack and supporting said stack in a jig of refractory material during the step of heating, said molybdenum wafers serving to minimize or prevent wetting of the jig by the tin.

8. The method of making a semiconductor device, comprising the steps of forming wafers of silicon, tin and aluminum, stacking such wafers in the order of tin, silicon, tin and aluminum, with titanium metal disposed between the wafers in intimate contact with the tin surfaces that face the silicon and aluminum wafers, and heating the stack in the absence of air to a temperature in the range of 550° C. to 850° C.

References Cited in the file of this patent

UNITED STATES PATENTS

| | | |
|---|---|---|
| 2,702,360 | Giacoletto | Feb. 15, 1955 |
| 2,736,639 | Ellis | Feb. 28, 1956 |
| 2,739,882 | Ellis | Mar. 27, 1956 |
| 2,781,481 | Armstrong | Feb. 12, 1957 |
| 2,783,197 | Herbert | Feb. 26, 1957 |
| 2,801,375 | Losco | July 30, 1957 |
| 2,836,522 | Mueller | May 27, 1958 |
| 2,837,448 | Thurmond | June 3, 1958 |
| 2,854,612 | Zaratkiewicz | Sept. 30, 1958 |
| 2,863,105 | Ross | Dec. 2, 1958 |